United States Patent [19]

Roos

[11] 4,012,586
[45] Mar. 15, 1977

[54] DEVICE FOR THE AMPLITUDE MODULATION OF AN ELECTRICAL SIGNAL

[75] Inventor: Jan Roos, Eindhoven, Netherlands
[73] Assignee: U.S. Philips Corporation, New York, N.Y.
[22] Filed: Aug. 26, 1975
[21] Appl. No.: 607,771
[30] Foreign Application Priority Data
Sept. 2, 1974 Netherlands .................. 7411606
[52] U.S. Cl. .................. 358/285; 310/8.1; 310/9.8; 332/3; 332/26
[51] Int. Cl.² .................. H04N 3/14
[58] Field of Search .......... 178/7.6, 7.1 R; 310/8, 310/8.1, 9.7, 9.8; 332/2, 3, 26; 331/107 A

[56] References Cited

UNITED STATES PATENTS

| 3,314,022 | 4/1967 | Meitzler | 331/107 A |
|---|---|---|---|
| 3,555,180 | 1/1971 | Cook | 178/7.1 |
| 3,826,865 | 7/1974 | Quate | 178/7.6 |
| 3,836,712 | 9/1974 | Kornreich | 178/7.6 |
| 3,869,682 | 3/1975 | Heeks | 332/26 |
| 3,886,503 | 5/1975 | Bert | 310/8 |
| 3,970,778 | 7/1976 | Adkins | 178/7.1 |
| 3,972,011 | 7/1976 | Coussot | 310/8.1 |

OTHER PUBLICATIONS

"Bleustein-Wave Amplification in Photoconducting CdS.", Electronic Letters, Feb. 1972, vol. 8, No. 3, pp. 60–62.

Primary Examiner—Benedict V. Safourek
Assistant Examiner—Michael A. Masinick
Attorney, Agent, or Firm—Frank R. Trifari; Bernard Franzblau

[57] ABSTRACT

A device for scanning patterns, e.g. optical patterns, in which on the surface of a piezo-electric material Bleustein-waves are produced, while in the material or in a semi-conductor layer deposited on the surface a drift field is produced. Said drift field pulsates between two levels, a low level at which the gain of the surface wave is independent of the "exposure" pattern and a high level at which the surface wave is locally amplified in accordance with the "exposure" pattern.

14 Claims, 3 Drawing Figures

DEVICE FOR THE AMPLITUDE MODULATION OF AN ELECTRICAL SIGNAL

The invention relates to a device for the amplitude modulation of an electrical signal comprising a wafer of a piezoelectric material, transducers for converting the electrical signal into a surface wave, in particular a Bleustein-Gulyaev-wave, and vice versa, free charge carriers being located within the range of influence of the electric field associated with the surface wave, in that the material on which the surface wave propagates is a semiconductor material and/or in that an additional layer of a semiconductor material is deposited on the piezoelectric material, and means for applying an electric drift field parallel to the direction of propagation of the surface wave.

In recent years surface waves have been frequently used in a wide variety of devices. A survey of these devices is given in an article entitled, "Surface-acoustic-wave components, devices and applications" in the "Proc. I.E.E.", Vol. 120, No. 10R, October 1973, pages 1078–1110. Various researchers are attempting to convert patterns, for example optical patterns, into electrical signals with the aid of surface waves.

The devices known so far do not allow of the continuous scanning of continuous patterns because either the pattern is non-continuous, as is for example the case with devices where an optical pattern is converted into electric currents through the material in which the wave propagates with the aid of a row of photocells, or because the electrical signal is non-continuous, as is the case with devices where an optical pattern is scanned with the aid of an electro-acoustic pulse.

It is an object of the invention to provide a device in which a continuous electrical signal is amplitude-modulated with a continuous pattern, which may for example be an optical pattern.

In order to accomplish this, the invention is characterized in that the drift field comprises at least two components, a component with a field strength at which the concentration of free charge carriers does not affect the gain or the attenuation of the surface wave, and a pulsating component, which is either zero or has such a value that the gain or attenuation of the surface wave under the influence of the sum of the two components is dependent on the concentration of free charge carriers.

In "Electronics Letters," Vol. 8, No. 3, 10 February 1972, pages 60–62, the influence of an electric drift field on the gain or attenuation of a Bleustein-Gulyaev-wave is described, which wave propagates in photoconducting CdS with the exposure of the material as a parameter. At a specific value of the applied drift field, also depending on the mobility of the free charge carriers, the drift velocity of the free charge carriers equals the velocity of propagation of the Bleustein-Gulyaev-wave, so that the gain or attenuation of the wave is independent of the other parameters of the free charge carriers, which parameters can be influenced externally by incident light.

The invention is based on the recognition that when the surface wave propagates monotonously if the pulsating component of the drift field has a value of zero, and that during a short time in which the pulsating component of the drift field is unequal to zero, the gain or attenuation of the surface wave depends on the exposure of the semiconductor material, so that the surface wave adopts an amplitude pattern in accordance with the exposure pattern.

It is evident that the invention is not limited to the optical exposure of a wafer of CdS propagating Bleustein-Gulyaev-waves, but that any material on which a surface wave propagates may be used, provided that there is a value of the applied drift field for which the gain or attenuation of the surface wave is independent of the "exposure". Said "exposure" need not necessarily be an optical exposure.

The invention will be described in more detail with reference to the accompanying drawing, in which:

FIG. 3b-e represent some amplitude patterns of the surface wave at different instants an exposure pattern according to FIG. 3a.

Figure 1:
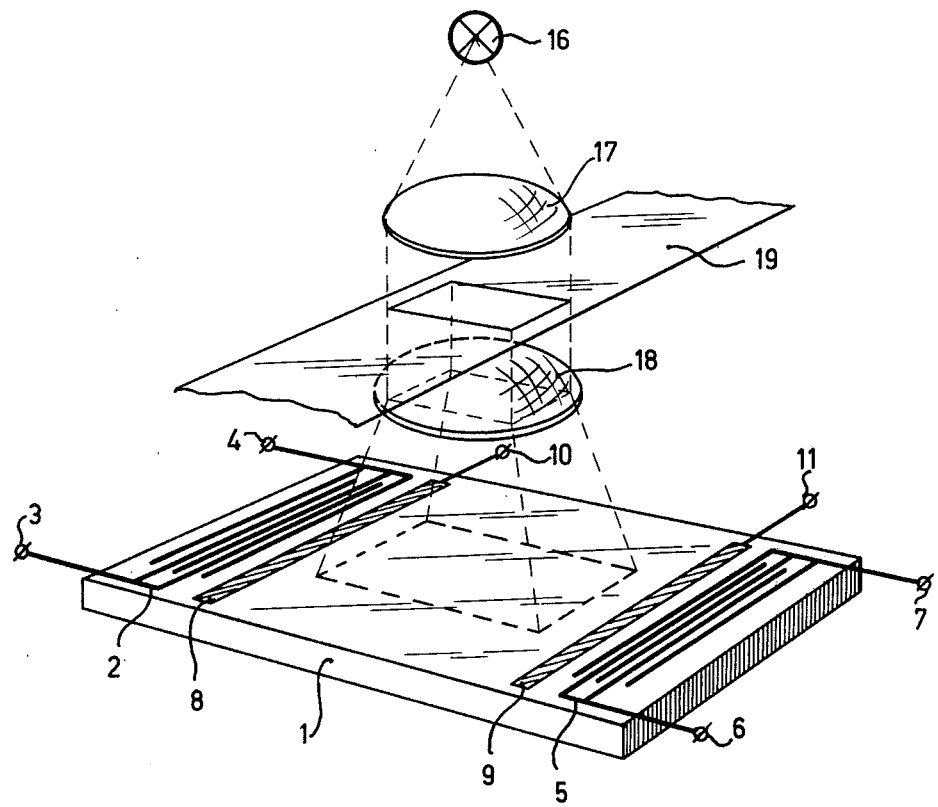
FIG. 1 shows a device according to the invention.

FIG. 1 shows the structure of a device according to the invention which includes a wafer of a piezo-electric material 1. Because, in the example shown, there is no semiconductor layer deposited on the wafer surface, it is made of a semiconductor type material, for example, CdS. A transducer 2 is arranged on the wafer 1 for converting an electrical signal applied to the input terminals 3 and 4 of said tranducer into a surface wave. At the other end of the wafer 1 a transducer 5 is arranged for converting the surface wave into an electrical signal, which is then available between the terminals 6 and 7. Furthermore, two ohmic contacts 8 and 9 are arranged on the material which cause an electric drift field in the material when an electric voltage is applied between the connection terminals 10 and 11. Terminals 10 and 11 are connected to the ohmic contacts 8 and 9 respectively. Between the ohmic contacts 8 and 9 an optical pattern may be projected in the case of CdS, for example, by means of a projection system which consists of a light source 16, a lens system 17 and 18 and a film 19. If the material 1 itself is non-conducting, a layer of a semiconductor material is deposited on it.

Figure 2:
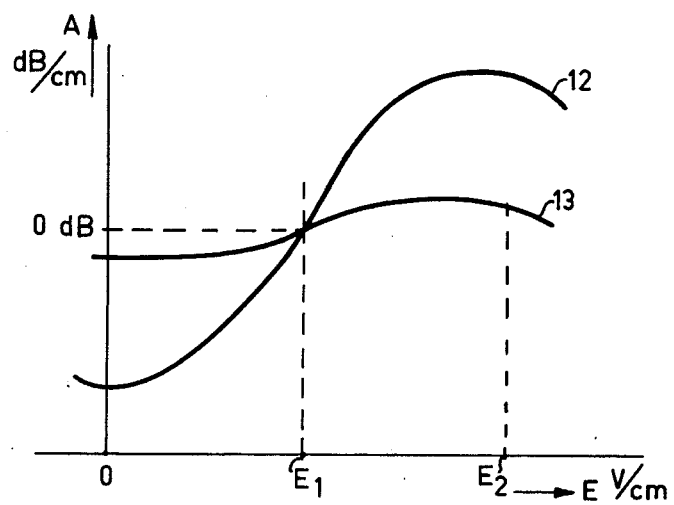
FIG. 2 represents the gain or attenuation of a surface wave as a function of the drift field and the exposure.

FIG. 2 represents the gain or attenuation A of a surface wave as a function of the drift field E and the exposure. Here the curve 12 corresponds to a high exposure and curve 13 to a low exposure. The point 0 dB represents the point where the gain or attenuation is independent of the exposure. For the complete device the gain at this point is unequal to 1 because both the transducers and the material itself are not free from losses. However, these losses are independent of the exposure and are left out of consideration. The 0-dB point appears at a drift field $E_1$, for example 800 V/cm. For the drift field $E_2$, for example 1600 V/cm, the gain depends on the exposure and may have values of for example 30 dB/cm. For CdS curves in accordance with FIG. 2 are known from the cited article in "Electronics Letters."

When the drift field is briefly increased from the value $E_1$ to the value $E_2$, the surface wave will adopt an amplitude pattern in accordance with the exposure pattern. This will be explained with reference to FIG. 3, in which the horizonal axis represents the line of propagation of the surface wave and the active range of the device lies between points 14 and 15, which range in the device of FIG. 1 lies between the ohmic contacts 8 and 9. Curve 3a then represents the exposure pattern, curve 3b the amplitude pattern of the surface wave for a drift field of the value $E_1$, curve $3c$ the amplitude pattern of the surface wave briefly after the drift field has been changed from the value $E_1$ to the value $E_2$, curve $3d$ represents the amplitude pattern of the surface wave at some later instant, and curve $3e$ the amplitude pattern some time after the drift field has been reduced from the value $E_2$ to the value $E_1$.

Figure 3:
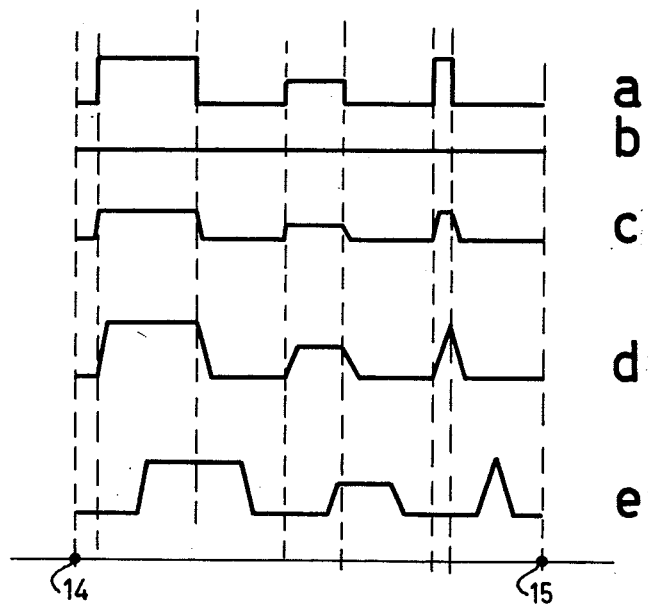

When the drift field is changed from the value $E_7$ to the value $E_2$, the surface wave will be amplified depending on the local exposure. The wave then propagates so that in the case of a rectangular pattern in accordance with FIG. $3a$, sloping edges are obtained on the amplitude pattern, FIGS. $3c$ and $3d$ represent two stages of this. After the drift field has been reduced from the value $E_2$ to the value $E_1$, the amplitude pattern further remains unchanged. The drift field may be increased again after a time which corresponds to the propagation delay of the wave between the points 14 and 15. Thus, a continuous electrical signal, which has been converted into a surface wave, is amplitude-modulated with an optical or non-optical pattern which can vary continuously, provided that this is effected comparatively slowly relative to the repetition frequency of the drift-field pulses. In the case of a transient-like variation of the pattern this must be effected in synchronism with the repetition frequency. FIG. 3 graphically shows that the resolution, i.e., the smallest detail of the exposure pattern to be reproduced, is determined by the distance travelled by the surface wave during the time that the drift field has the value $E_2$, or the product of the velocity of propagation of the surface wave and the pulse duration of the pulsating drift field.

The scope of the invention is not limited to optical exposure of CdS. It will be evident that numerous other "exposures" are possible. For example, free charge carriers may be influenced by means of transverse magnet fields via the so-called Hall-effect.

What is claimed is:

1. A device for the amplitude-modulation of an electrical signal, comprising a wafer of a piezoelectric material, a first transducer coupled to the wafer for converting the electrical signal into a Bleustein-Gulyaev acoustic surface wave, a second transducer coupled to the wafer at a point spaced apart from the first transducer for converting surface waves into electric signals, free charge carriers being located within the range of influence of the electric field associated with the surface wave, the material on which the surface wave propagates being a semi-conductor material, and means for applying an electric drift field parallel to the direction of propagation of the surface wave, the drift field comprising at least two components, one component with a field strength at which the concentration of free charge carriers does not influence the gain or attenuation of the surface wave, and a pulsating component, which is either zero or has such as value that the gain or attenuation of the surface wave under the influence of the sum of the two components is dependent on the concentration of free charge carriers.

2. A device as claimed in claim 1 wherein said electric drift field applying means comprises first and second elongate ohmic contacts disposed on the surface of the wafer between said first and second transducers and having terminals for connection to a source of DC voltage.

3. A device as claimed in claim 1, characterized in that the wafer material comprises a photo-conducting piezo-electric material, and further comprising means for projecting an optical pattern on the surface on which the Bleustein-Gulyaev-wave propagates.

4. A device as claimed in claim 3 wherein the wafer material comprises cadmium sulfide.

5. A device for the amplitude-modulation of an electric signal comprising, a wafer composed of a piezoelectric material, a layer of semiconductor material disposed on one surface of the wafer, a first transducer coupled to said one surface of the wafer for converting an electric signal into a Bleustein acoustic surface wave, a second transducer coupled to said one surface of the wafer at a point spaced apart from the first transducer for converting acoustic surface waves into electric signals, free charge carriers being located within the range of influence of the electric field associated with the surface wave, and means for applying an electric drift field parallel to the direction of propagation of the surface wave, the drift field comprising at least two components, one component with a field strength at which the concentration of free charge carriers does not influence the gain or attenuation of the surface wave, and a pulsating component, which is either zero or has such a value that the gain or attenuation of the surface wave under the influence of the sum of the two components is dependent on the concentration of free charge carriers.

6. A device as claimed in claim 5 further comprising means for imaging an exposure pattern onto said layer of semiconductor material in a region between said transducers.

7. A device as claimed in claim 5 wherein the semiconductor material is photoconductive, said device further comprising means for projecting an optical pattern onto said layer of semiconductor material.

8. A device as claimed in claim 5 wherein said electric drift field applying means comprises first and second elongate ohmic contacts disposed on the surface of the wafer between said first and second transducers and having terminals for connection to a source of DC voltage.

9. Apparatus for converting an optical pattern into an electric signal comprising, a substrate having a surface layer made of a material capable of propagating an acoustic surface wave and exhibitng semiconductor properties, a first transducer coupled to the substrate for converting an electric signal into an acoustic surface wave, a second transducer coupled to the substrate and spaced apart from the first transducer for converting an acoustic surface wave into an electric signal, means for imaging said optical pattern onto the substrate surface layer in a region between said first and second transducers, and means for applying an electric drift field parallel to the direction of propagation of the surface wave, said drift field being switched between first and second levels, a first level $E_1$ at which the gain or attenuation of the surface wave is independent of said imaged optical pattern and a second level $E_2$ at which the gain or attenuation of the surface wave is dependent upon the imaged optical pattern.

10. Apparatus as claimed in claim 9 wherein said substrate comprises a wafer of piezoelectric material and a layer of photoconductive semiconductor material disposed on the surface wave propagation surface thereof.

11. Apparatus as claimed in claim 9 wherein said substrate comprises a wafer of photoconductive piezoelectric material.

12. Apparatus as claimed in claim 9 wherein said wafer is composed of cadmium-sulphide.

13. Apparatus as claimed in claim 9 wherein said electric drift field applying means comprises first and second parallel elongate contacts disposed on the substrate perpendicular to the direction of propagation of the surface wave and in a region between said first and second transducers and connected to a switchable source of DC voltage.

14. Apparatus as claimed in claim 9 wherein the electric drift field is switched at a frequency determined by the spacing of said transducers and the propagation velocity of the acoustic surface wave.

* * * * *

UNITED STATES PATENT AND TRADEMARK OFFICE
CERTIFICATE OF CORRECTION

PATENT NO. : 4,012,586
DATED : March 15, 1977
INVENTOR(S) : JAN ROOS

It is certified that error appears in the above-identified patent and that said Letters Patent are hereby corrected as shown below:

Column 2, line 18, after "instants" it should read

--for--;

Column 3, line 8, "$E_7$" should read --$E_1$--.

Signed and Sealed this

Twenty-eighth Day of June 1977

[SEAL]

Attest:

RUTH C. MASON
*Attesting Officer*

C. MARSHALL DANN
*Commissioner of Patents and Trademarks*